United States Patent [19]
Ishii et al.

[11] Patent Number: 5,314,740
[45] Date of Patent: May 24, 1994

[54] BASE BOARD FOR PRINTED CIRCUIT BOARD

[75] Inventors: Kenji Ishii; Yoshinori Kondo; Hiroyuki Matsumoto; Norio Sayama, all of Tokyo, Japan

[73] Assignee: Mitsubishi Gas Chemical Company, Inc., Tokyo, Japan

[21] Appl. No.: 935,245

[22] Filed: Aug. 27, 1992

[30] Foreign Application Priority Data

Aug. 28, 1991 [JP] Japan .................. 3-242779
Aug. 28, 1991 [JP] Japan .................. 3-242780
Aug. 28, 1991 [JP] Japan .................. 3-242781

[51] Int. Cl.$^5$ ............................. B32B 9/00
[52] U.S. Cl. .................. 428/209; 428/901; 361/750
[58] Field of Search ........... 428/209, 901, 913, 457; 430/281; 358/106; 356/387, 237, 394; 361/750

[56] References Cited

U.S. PATENT DOCUMENTS

| | | | |
|---|---|---|---|
| 4,774,188 | 9/1988 | Chandross | 428/901 |
| 4,965,208 | 10/1990 | Blitchington | 428/901 |
| 5,160,787 | 11/1992 | Gaku | 428/901 |

OTHER PUBLICATIONS

Coombs, "Printed Circuit Handbook", 1988, p. 31.9.
Allen "Photopolymerisation & Photoimaging Science & Technology", Elsevier Science Pub., 1989 pp. 1-40.

*Primary Examiner*—Patrick J. Ryan
*Assistant Examiner*—Patrick Jewik
*Attorney, Agent, or Firm*—Wenderoth, Lind & Ponack

[57] ABSTRACT

A base board for a printed circuit board panel which permits easy inspection of a printed circuit by means of a fluorescence-applied circuit pattern inspection machine used for the inspection of printed circuit patterns and which is not altered in the properties as a printed circuit board, the base board having an insulating layer containing 5.0 to 0.00001% by weight of a compound of any one of the formulae (1), (2) and (3),

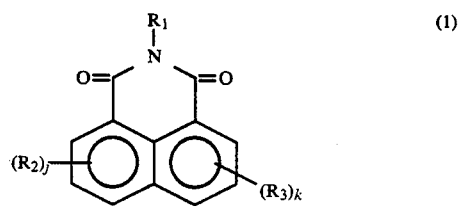
(1)

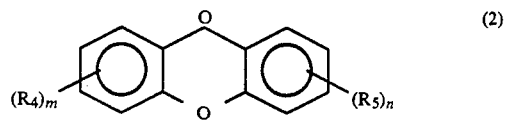

(2)

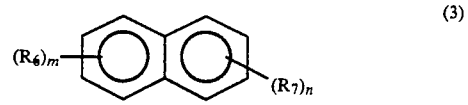

(3)

17 Claims, No Drawings

BASE BOARD FOR PRINTED CIRCUIT BOARD

BACKGROUND OF THE INVENTION

1. Field of the Invention

The present invention relates to a base board for a printed circuit board panel which permits easy inspection of a printed circuit by means of a fluorescence-applied circuit pattern inspection machine used for the inspection of printed circuit patterns and which is not altered in the properties as a printed circuit board.

2. Prior Art of the Invention

The circuit pattern of a printed circuit board is conventionally inspected by a direct continuity method using a probe, a metallurgical microscope-applied method using reflected light from a metal conductor circuit pattern, or a method using a soft X-ray.

The circuit pattern is recently beginning to be inspected by a more accurate and highly efficient method in which a pattern of fluorescence generated from the circuit pattern of a manufactured printed circuit board is compared with a pattern of fluorescence generated from the circuit pattern of a reference normal circuit pattern by means of a phenomenon that the resin layer of a printed circuit board generates fluorescence under irradiation with excited light while a conductor pattern does not generate fluorescence.

When, however, there is an internal layer of a circuit or when the resin layer is too thin, there are some cases where insufficient inspection is possible, since fluorescence is not sufficiently strong, or the fluorescent pattern is affected by the presence or absence of the conductor circuit of the internal layer, the presence or absence of the conductor circuit on the surface opposite to the surface to be inspected, or a difference caused by whether or not a pigment and a filler are used.

To overcome the above defect, JP-A-3-2258 discloses a method using a fluorescent brightener, specifically a coumarin-containing fluorescent brightener. In this method, however, the amount of fluorescence is sometimes insufficient or the amount of fluorescence having a wavelength with which to inspect a pattern is sometimes small. The defect with this method is that when the amount of the fluorescent brightener is increased to overcome the above problem, the properties of the base board alter.

SUMMARY OF THE INVENTION

It is an object of the present invention to provide a base board for the manufacture of a printed circuit board which can be sufficiently inspected on its printed circuit by means of a fluorescence-applied circuit pattern inspection machine.

It is another object of the present invention to provide a base board containing a small amount of a specific compound which does not affect the properties of the board and enables the sufficient inspection of a printed circuit by means of a fluorescence-applied circuit pattern inspection machine.

It is further another object of the present invention to provide a base board which is excellent in shielding against light from a high-pressure mercury lamp and metal halide lamp and gives a printed circuit board which can be sufficiently inspected by means of a fluorescence-applied circuit pattern inspection machine.

According to the present invention, there is provided a base board for a printed circuit board, which has an insulating layer containing 5.0 to 0.00001% by weight of a compound of any one of the formulae (1), (2) and (3),

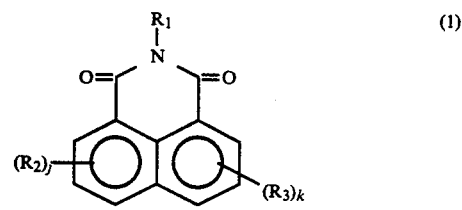

wherein $R_1$ is hydrogen, optionally substituted alkyl or optionally substituted aryl.

Each of $R_2$ and $R_3$ is, independently of the other, hydroxyl, amino, carboxyl, sulfone,
a salt of hydroxyl, a salt of amino, a salt of carboxyl, a salt of sulfone,
hydroxyl to which optionally substituted alkyl is bonded,
amino to which optionally substituted alkyl is bonded,
carboxyl to which optionally substituted alkyl is bonded,
sulfone to which optionally substituted alkyl is bonded,
hydroxyl to which optionally substituted aryl is bonded,
amino to which optionally substituted aryl is bonded,
carboxyl to which optionally substituted aryl is bonded,
sulfone to which optionally substituted aryl is bonded,.
hydroxyl to which optionally substituted acyl is bonded,
amino to which optionally substituted acyl is bonded,
carboxyl to which optionally substituted acyl is bonded,
sulfone to which optionally substituted acyl is bonded,
a salt of alkyl, a salt of aryl, a salt of acyl,
halogen,
optionally substituted alkyl,
or optionally substituted aryl, and each of j and k is an integer of 0 to 3,

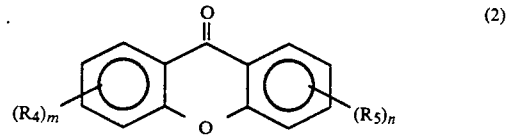

wherein each of $R_4$ and $R_5$ is, independently of the other, hydroxyl, optionally substituted saccharide, optionally substituted alkoxy, optionally substituted acyl, optionally substituted acyloxy, optionally substituted alkyl or optionally substituted aryl, and each of m and n is an integer of 0 to 4, provided that m and n are defined by $m+n \geq 1$, and

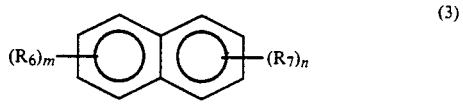

wherein each of $R_6$ and $R_7$ is, independently of the other, hydroxyl, amino, sulfone, nitro or a salt of any one of these, provided that at least one of $R_6$ and $R_7$ is sulfone, nitro or a salt of these, and each of m and n is an integer of 0 to 4, provided that m and n are defined by $m+n \geq 1$.

Further, according to the present invention, there is provided a base board for a printed circuit board, which is obtained by incorporating into the above base board a light-shielding agent against light having a wavelength of 300 to 420 nm to which a resist layer is exposed.

DETAILED DESCRIPTION OF THE INVENTION

The present inventors have made a diligent study to develop a base board which is processed into a printed circuit board and permits sufficient inspection of a printed circuit by a fluorescence-applied circuit pattern inspection method and which is not at all altered in properties for a printed circuit board. As a result, there has been found a base board which can sufficiently meet with a fluorescence-applied circuit pattern inspection machine, and on the basis of this finding, the present invention has been completed.

The constitution of the present invention will be described hereinafter.

The base board of the present invention comprises an insulating layer containing a compound of the above formula (1), (2) or (3), and includes a variety of base boards if their insulating layers contain a compound of the above formula (1), (2) or (3).

The base board of the present invention typically includes (1) a prepreg formed of a reinforcing substrate and a thermosetting resin, (2) a copper-unclad laminate obtained by stacking a plurality of prepregs, (3) a single-side or both-side copper-clad laminate obtained by bonding copper foil(s) on one surface or both surfaces of the laminate, and (4) a copper-clad, multilayer board obtained by combining and laminating print wiring board(s) as internal layer(s), multilayer-forming prepreg(s) as bonding layer(s) and either a copper foil or a single-sided copper-clad laminate. In addition to these, the base board of the present invention also includes (5) a laminate having a metal core layer such as an aluminum layer or a copper-Invar, (6) a ceramic-resin composite board obtained by impregnating a porous ceramic board with a resin and curing the resin, (7) a copper-clad ceramic board obtained by bonding a copper foil on a ceramic-resin composite board optionally through a prepreg, and (8) a flexible, copper-clad board obtained by bonding a copper foil on a polyimide film with an adhesive.

The term "insulating layer" used in the present invention includes the above prepreg and a combination of the prepreg and an adhesive layer formed thereon.

The base board of the present invention is used to make it easier to inspect the printed circuit pattern formed on the surface thereof. Therefore, the compound of the above formula (1), (2) or (3) is required to be contained in the insulating layer forming the surface layer of the base board. For example, in copper-clad laminate of any kind, the compound of the above formula (1), (2) or (3) is contained in the layer underlying the copper foil.

The reinforcing substrate as a component for the above prepreg is selected from known reinforcing materials such as a woven or nonwoven fabric of glass and a woven or nonwoven fabric of a mixture of glass and other fiber. Particularly preferred is a nearly transparent reinforcing substrate which is formed from woven fabrics or nonwoven fabrics of a glass fiber such as E glass, S glass, D glass or quartz glass. Although not specially limited, the thickness of the reinforcing substrate is preferably 0.03 to 0.40 mm.

The thermosetting resin which is impregnated into the substrate or which is used as an adhesive layer to bond a copper foil on an outer layer is selected from a variety of known thermosetting resins. In the present invention, particularly preferred is an epoxy resin. The thermosetting resin includes epoxy resins such as a bisphenol A type epoxy resin, a novolak type epoxy resin, a halogenated bisphenol A type epoxy resin, a halogenated novolak type epoxy resin and other polyfunctional epoxy compounds having at least three functional groups; a mixture of the above epoxy resin with a heat-resistant engineering plastic such as polyether imide or polyphenylene ether, or a saturated or unsaturated polyester resin; a mixtures of the above epoxy resin with a known curing agent such as dicyandiamide or diaminodiphenylmethane, or a phenol such as a phenol novolak resin or acid anhydride; and a mixture of the above epoxy resin with an imidazole such as 2-methylimidazole, 2-ethyl-4-methylimidazole, 2-undecylimidazole, 2-heptadecylimidazole, 2-phenylimidazole, 1-benzyl-2-methylimidazole, or a curing catalyst such as benzyldimethylamine; and a mixture of the above epoxy resin with an inorganic filler, an organic filler, a flame retardant, a pigment or a dye. A thermosetting resin composition prepared by incorporating a polyvinyl butyral resin or a melamine resin into one of the above thermosetting resins may be also used as an adhesive layer.

The compound of the formula (1), used in the present invention, is a compound widely used as a naphthalimide-containing synthetic dye. As the substituents, $R_1$, $R_2$ and $R_3$, a variety of substituents are know. As an additive to a resin, optimum compounds are selected in view of thermal stability and coloring properties, while compounds having sodium sulfonate, etc., as a substituent can be also used in the present invention, since even a small amount of the compound of the formula (1) can have an effect in the present invention.

Specific examples of the compound of the formula (1) include naphthalene-1,8-dicarbonylimide, 1-chloronaphthalene-4,5-dicarboxyl-N-methylimide, 4,5-dichloronaphthalene-1,8-dicarboxylic acid-N-methylimide, N-phenyl-4-amino-1,8-naphthalimide, N-(3',4'-dimethylphenyl)-4-amino-1,8-naphthalimide, 4-amino-N-methylnaphthalimide, N-methyl-4-hydroxynapthalimide, N-ethyl-4-hydroxynaphthalimide, N-(n-butyl)-4-(N'-n-butylamino)-1,8-naphthalimide, 2-alkoxy(C=-1-2)-1,8-naphthalenedicarboxylic acid-N-methylimide, N-(N'-alkoxy(C=1-2)-1',8'-naphthalimide-(4')-yl)alkoxy(C=1-2)-1,8-naphthalimide, N-(3'-methoxypropyl)-4-hydroxynaphthalimide, 1,4-bis-(alkoxy(C=1-2)-1,8-naphthalimide)benzene, N-methyl-1-sulfonaphthalene-4,5-dicarboxylic acid amide and acid thereof, N-ethyl-1-sulfo-4,5-naphthalenedicarboxylic acid imide and salt thereof, N-ethyl-4-sulfonaphthalimide and salt thereof, N-(2',4'-dimethylphenyl)naphthalene-1,8-dicarboxylic acid imide-4-sulfonic acid and salt thereof, N-(3'-methoxy-n-propyl)naphthalene-4,5-dicarboxylic acid imide-1-sulfonic acid and salt thereof, and N-(3'-isopropoxy-n-propyl)naphthalene-4,5-dicarboxylic acid imide-1-sulfonic acid and salt thereof.

The compound of the formula (2) is a compound in which substituents $R_4$ and $R_5$ are substituted on a xanthone ring. Xanthone derivatives widely naturally occur. Examples of the substituents, $R_4$ and $R_5$, includes hydroxyl, a saccharide which may have a substituent, alkoxy which may have a substituent, acyl, acyloxy, alkyl and aryl. Hydroxyl is a typical substituent as $R_4$ and $R_5$. For example, gentisin is a compound in which hydroxyl is substituted on a xanthone ring. Examples of the compound of the formula (2) include gentianine, isogentisin, gentioside, gentisin, those in which alkyl, alkyloxy, acyloxy and acyl are substituted by a chemical reaction, and those obtained by etherifying or esterifying hydroxyl groups of the above saccharides.

Typical examples of the compound of the formula (3) includes a group of compounds known as flavianate dyes. Specific examples thereof include 2,4-dinitro-1-naphthol-7-sulfonic acid (flavianic acid), 1-nitro-1-naphthol and 1-naphthylamine-2,7-disulfonic acid.

In the base board for a printed circuit board, provided by the present invention, the insulating layer contains 0.00001 to 5.0% by weight of the compounds of the formula (1), (2) or (3). The optimum content of the compound of the formula (1), (2) or (3) differs depending upon the kind of the compound, a method of use of the compound, the thickness of the insulating layer, the thickness of a substrate impregnated with a resin into which the compound of the formula (1), (2) or (3) is incorporated, and the thickness of an adhesive layer into which the compound of the above formula (1), (2) or (3) is incorporated. The insulating layer is formed of a thermosetting resin and a reinforcing material or of a thermosetting resin and a reinforcing material or of a thermosetting resin, a reinforcing material and an adhesive layer. In the latter case, the compound of the above formula (1), (2) or (3) can be incorporated into any one of the thermosetting resin and the adhesive layer. Further, the adhesive layer containing the compound of the formula (1), (2) or (3) may be formed on that surface of a copper foil which is treated (roughened) for adhesion, whereby there is obtained a copper foil with an adhesive layer.

For example, the compound of the formula (1) is used preferably in an amount of 0.03 to 0.00005% by weight based on the thermosetting resin, 0.1 to 0.001% by weight based on the reinforcing material, or 0.1 to 0.003% by weight based on the resin solid content in the adhesive layer. The compound of the formula (2) is used preferably in an amount of 0.01 to 1.0% by weight based on the thermosetting resin, 0.05 to 3.0% by weight based on the reinforcing material, or 0.05 to 1.0% by weight based on the resin solid content in the adhesive layer. The compound of the formula (3) is preferably used in an amount of 0.001 to 0.03% by weight based on the thermosetting resin, 0.01 to 0.1% by weight based on the reinforcing material, or 0.03 to 1.0% by weight based on the resin solid content in the adhesive layer.

The base board for a printed circuit board, provided by the present invention, is obtained by laminated molding of prepreg(s), copper foil and conventional prepreg(s) as required. The prepreg use in the present invention includes (a) a prepreg obtained by a method in which a reinforcing substrate is impregnated with a matrix resin such as a thermosetting resin containing any one of the compounds of the formulae (1), (2) and (3) and the resin is heated to dry it, (b) a prepreg obtained by a method in which any one of the compounds of the formulae (1), (2) and (3) is allowed to adhere to a reinforcing substrate, the reinforcing substrate is then impregnated with a general thermosetting resin, and the resin is heated to dry it, and (c) a prepreg obtained by a method in which a layer of a thermosetting resin containing any one of the compounds of the formulae (1), (2) and (3) is formed on a general prepreg.

Further, the above copper foil includes copper foil to which an adhesive layer containing any one of the compounds of the formulae (1), (2) and (3) is attached, The copper foil to which an adhesive layer is attached is obtained by a method in which the above layer is formed on a roughened surface of copper foil.

When any one of the above prepregs (a), (b) and (c) is used, it is preferred to stack it as an outermost layer.

When the base board for a printed circuit board, provided by the present invention, is produced, the physical properties of the compounds of the formulae (1), (2) and (3), an inner prepreg, an inner printed circuit, use of an inner prepreg containing the compound of the formula (1), (2) or (3), use of a filler, etc., are considered for determining the amount of the compound of the formulae (1), (2) or (3), the method of incorporating the compound of the formula (1), (2) or (3).

The compounds of the above formulae (1), (2) and (3) are excited by a laser light having a wavelength of 442 nm to generate fluorescence, and at least 30% of the fluorescence, or at least 60% of the fluorescence from certain compounds, is in the wavelength region of 490 to 620 nm. In the insulating layer containing the compound of the formula (1), (2) or (3), the relative fluorescence amount (to be defined below) in the wavelength region of 490 to 620 nm is preferably at least 10 times the fluorescence amount of an insulating layer which does not contain any one of the compounds of the formulae (1), (2) and (3).

The relative fluorescence amount is measured with Vision 206E (supplied by OPTROTECH Ltd.) in the following manner.

In the Vision 206E, a sample is irradiated and scanned with laser light having a wavelength of 442 nm from a laser positioned above, and at the same time, fluorescence having a wavelength of 490 to 620 nm from the irradiated portion is detected with a fluorescence detector positioned above.

That is, a standard plate having fluorescent strength 100 times the fluorescent strength of a 0.1 mm thick glass epoxy, double side copper-clad laminate containing no fluorescence agent is set in the Vision 206E, and the detection sensitivity of the Vision 206E was adjusted under irradiation with laser light such that the detected fluorescent strength was 100 times the fluorescent strength of the above standard. A sample is set and measured for a fluorescent strength as described above. The so-obtained value is expressed as a relative fluorescence amount.

The base board for a printed circuit board, provided by the present invention, is generally inspected by a method in which a pattern of fluorescence having a wavelength of 490 to 620 nm generated from the circuit pattern of a manufactured printed circuit board under irradiation with laser light having a wavelength of 442 nm is compared with a pattern of fluorescence generated from the circuit pattern of a reference normal circuit pattern.

The base board for a printed circuit board, provided by the present invention, includes a laminate composed of a prepreg containing the compound of the formula (1), (2) or (3). The present invention includes use of a prepreg containing the compound of the formula (1), (2) or (3) as a base board, or part of a base board, for a printed circuit board, use of a reinforcing material to which the compound of the formula (1), (2) or (3) is allowed to adhere as a reinforcing material for a base board for a printed circuit board, and a use of a copper foil to which an adhesive containing the compound of the formula (1), (2) or (3) is attached as a copper foil for a base board for a printed circuit board.

In the present invention, a compound which absorbs, or works as a shield against, light having a wavelength of 300 to 420 nm for exposure may be incorporated into the insulating layer to prevent the transmission of light (from a high-pressure mercury lamp or a metal halide lamp for forming a resist pattern) to the reverse side of the board when a resist pattern is formed. Specifically, the base board for a printed circuit board, provided by the present invention, can be used as a base board for use in a method in which the base board is simultaneously exposed for forming etched resist patterns or solder resist patterns.

The above compound (light-shielding compound) includes photopolymerization initiators generally used in a composition which contains a compound having an unsaturated carbon-carbon double bond such as acrylate and photopolymerized under irradiation with ultraviolet light such as acetophenone, benzoin, αacyloxime ester, acylphosphine oxide, substituted α-aminoketone, hydrogen-eliminating Michler's ketone, thioxanthone and alkylthioxanthone; photopolymerization aids which promote the activation by irradiation with ultraviolet light such as acenaphthene and fluorene; benzotriazoles or ultraviolet light absorbers such as 2-(2-hydroxy-5-methylphenyl)benzotriazole, 2-(2-hydroxy-3,5-di-tert-butylphenyl)benzotriazole, 2-(2-hydroxy-3,5-di-tert-amylphenyl)benzotriazole and 2-(2-hydroxy-3-tertbutyl-5-methylphenyl)-5-chlorobenzotriazole; and fluorescent brighteners.

The amount of the above compound as a light-shielding or absorbing agent for use is in the range of 0.2 to 6% by weight based on the total solid content of the thermosetting resin. When the thickness of a laminate is small, when it is used in a prepreg, or when it is incorporated into only the adhesive layer for a copper foil, it is used in a relatively larger amount in the range of 1 to 6% by weight, particularly 2 to 6% by weight. When the thickness is large and when it is entirely uniformly incorporated, it is used in a relatively small amount in the range of 0.2 to 2% by weight. When the amount is less than the above lower limit, the ultraviolet light absorption capability is insufficient. Any amount exceeding 6.0% by weight is an excess and unnecessary.

In the present invention, those containing alkylthioxanthone of the following formula (4) are preferred.

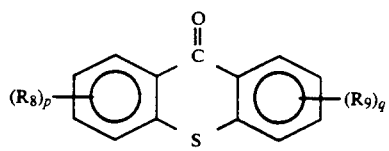

(4)

wherein each of $R_8$ and $R_9$ is alkyl, each of p and q is an integer of 0 to 4, and $p+q \geq 1$.

The base board for a printed circuit board, provided by the present invention, achieves the desired generation of fluorescence by containing a very small amount of the compound of the formula (1), (2) or (3), and permits the inspection of easy inspection of a printed circuit by means of a fluorescence-applied circuit pattern inspection machine used for the inspection of printed circuit patterns.

Further, the base board for a printed circuit board, provided by the present invention, is excellent in shielding properties against light for resist exposure from a high-pressure mercury lamp or a metal halide lamp, and suitable for use in a method in which the base board is simultaneously exposed for forming etched resist patterns or solder resist patterns.

The present invention will be described further in detail hereinafter by reference to Examples, in which "part" and "%" stand for "part by weight" and "% by weight" unless otherwise specified.

EXAMPLES 1 AND 2

100 Parts of a brominated bisphenol A type epoxy resin (trade name: Epikote 1045, Br content 18–20%, epoxy equivalent 450–500, supplied by Yuka Shell Epoxy Kabushiki Kaisha), 3.5 parts of dicyandiamide and 0.2 part of 2-methylimidazole were dissolved in a mixed solvent prepared from methyl ethyl ketone and N,N-dimethylformamide to obtain an epoxy resin varnish (to be referred to as V1 hereinafter).

N-(n-butyl)-4-(N'-butylamino)-1,8-naphthalimide (to be referred to as NAI hereinafter) was added to V1 in such an amount that the proportion of NAI based on the resin solid content was 0.003%, and a plain-woven glass fabric having a thickness of 0.1 mm was impregnated with the so-prepared varnish. Separately, NAI was also added to the same varnish as the above V1 in such an amount that the proportion of the fisetin based on the resin solid content was 0.0005%, and the same plain-woven glass fabric as above was impregnated with the so-prepared varnish. These impregnated fabrics were dried at 160° C. for 6 minutes to obtain prepregs having a resin content of 45% (to be referred to as PP1 and PP2 hereinafter).

An electrolytic copper foil having a roughened surface for adhesion and having a thickness of 35 μm was placed on each surface of each of the above PP1 and PP2, and laminate-molded at 170° C. under a pressure of 30 kg/cm² for 2 hours to give both-side copper clad laminates having an insulating layer thickness of 0.1 mm.

The above-obtained copper-clad laminates were etched to remove the entire copper foil from one surface each and a half of the copper foil from the other surface each (double-side copper-removed portion-=unclad surface, and one-side copper-removed portion=copper-clad surface).

These copper-clad laminates were measured for an amount of generated fluorescence with Vision 206E (supplied by OPTROTECH Ltd.) in the following manner. Table 1 shows the results.

In the Vision 206E, a sample was irradiated and scanned with laser light having a wavelength of 442 nm from a laser positioned above, and at the same time, fluorescence having a wavelength of 490 to 620 nm from the irradiated portion was detected with a fluorescence detector positioned above.

That is, a standard plate having fluorescent strength 100 times the fluorescent strength of a 0.1 mm thick glass epoxy, double side copper-clad laminate containing no fluorescence agent was set in the Vision 206E, and the detection sensitivity of the Vision 206E was adjusted under irradiation with laser light such that the detected fluorescent strength was 100 times the fluorescent strength of the above standard. A sample was set and measured for a fluorescent strength as described above. The so-obtained values were expressed as a relative fluorescence amount.

EXAMPLE 3

A prepreg (to be referred to as PP3 hereinafter) was prepared in the same manner as in Example 1 except that the varnish for impregnation was replaced with a varnish prepared by adding NAI, 2,4-diethylthioxanthone (to be referred to as ESX hereinafter) and 2-(2-hydroxy-3,5-di-tert-amylphenyl)benzotriazole (to be referred to as BTA hereinafter) to V1 in such amounts that the proportions of these additional components in the above order based on the resin solid content were 0.003%, 2.0% and 2.0%. Then, a double-side copper-clad laminate was prepared and measured for a relative fluorescence amount in the same manner as in Example 1. Table 1 shows the result.

Further, all the remaining copper foil was removed from the above laminate by etching. The so-prepared laminate was placed in a distance of 20 cm from a high-pressure mercury lamp (wavelength 300–400 nm, 1 kW, H1 type, supplied by USHIO U-TECH Inc.) and irradiated with light from the high-pressure mercury lamp up to 1,000 mJ/cm$^2$ to measure light transmissivity and amounts of transmitted light. Further, the above laminate was also irradiated with light from a metal halide lamp (wavelength 380-420 nm, 1 kW, GL type, supplied by USHIO U-TECH, Inc.) at a light intensity of 24 mW/cm$^2$ up to 1,000 mJ/cm to measure light transmissivity and amounts of transmitted light (to be referred to as "exposure shielding properties" hereinafter). Table 2 shows the results.

EXAMPLES 4–6 AND COMPARATIVE EXAMPLES 1–3

NAI was added to a silane-coupling agent, and the same woven glass fabric as that used in Example 1 was treated with the silane coupling agent to obtain a substrate having an NAI adherence amount of 0.01%. This substrate was impregnated with V1 in the same manner as in Example 1 to obtain a prepreg having a resin content of 45% (to be referred to as PP4 hereinafter). Then, a double-side, copper-clad laminate was prepared from PP4 in the same manner as in Example 1, and treated and measured for a relative fluorescence amount in the same manner as in Example 1. Table 1 shows the result.

Separately, a woven glass fabric having a thickness of 0.1 mm was impregnated with V1, and the impregnated fabric was dried at 160° C. for 6 minutes to obtain a prepreg having a resin content of 45% (to be referred to as PPC). NAI was added to V1 in such an amount that the proportion of NAI was 0.05% based on the solid resin content, and the resultant varnish was applied to each surface of PPC and dried to give a prepreg on each surface of which an adhesive layer having a thickness of 20 μm was formed (to be referred to as PP5 hereinafter). Then, a double-side, copper-clad laminate was prepared from PP5 in the same manner as in Example 1, and treated and measured for a relative fluorescence amount in the same manner as in Example 1. Table 1 shows the result. Further, the above varnish was also applied to a roughened surface of each of two copper foil sheets to obtain two copper foil sheets having an adhesive layer having a thickness of 20 μm (to be referred to as Cu6). Then, a double-side, copper-clad laminate was prepared from the same prepreg as PPC and Cu6, and treated and measured for a relative fluorescence amount in the same manner as in Example 1. Table 1 shows the results.

Separately, prepregs (to be referred to as PPC1 and PPC2 hereinafter) were prepared in the same manner as in Examples 1 and 2 except that the varnish for impregnation was replaced with varnishes prepared by adding coumarin-based fluorescent brightener to PPC and V1 in such amounts that the proportions of the brightener based on the resin solid content were 0.03% and 0.1%. Double-side copper-clad laminates were prepared and measured for relative fluorescence amounts in the same manner as in Example 1. Table 1 shows the results.

As shown in Table 1, the increase of the fluorescence agent amount is not in proportion to the increase of the relative fluorescence amount. That is, when the amount of the fluorescence agent was increased up to 6 times, the relative fluorescence amount increased up to 3 times. Further, the relative fluorescence amount in an unclad surface was much larger than about 2 times expected on the basis of a simple model, that is, it was about 3 to 4 times larger than that in a copper-clad surface.

The reasons for the above phenomenon are not clear, but assumed as follows. An epoxy resin is sensitized with fluorescence from the fluorescence agent to generate fluorescence, or laser light is irregularly reflected within the insulating layer, on the insulating layer surface and on a bed on which a sample is placed. Therefore, the volume from which fluorescence is generated increases.

TABLE 1

| | | | | Relative fluorescence amount | |
|---|---|---|---|---|---|
| Example | Prepreg | Compound | Proportion | Unclad surface | Copper-clad surface |
| Ex. 1 | PP1 | NAI | 0.003 | 210 | 50 |
| Ex. 2 | PP2 | NAI | 0.0005 | 100 | 30 |
| Ex. 3 | PP3 | NAI | 0.003 | 200 | 50 |
| | | ESX | 2.0 | | |
| | | BTA | 2.0 | | |
| Ex. 4 | PP4 | NAI (adhering to substrate) | 0.01 | 200 | 60 |
| Ex. 5 | PP5 | NAI (in adhesive layer on PP) | 0.05 | 150 | 40 |
| Ex. 6 | PPC | NAI (in adhesive layer on copper, Cu6) | 0.05 | 150 | 40 |
| CEx. 1 | PPC | nil | | 3.0 | 1.0 |
| CEx. 2 | PPC1 | coumarin-based | 0.03 | 4.0 | 1.0 |
| CEx. 3 | PPC2 | coumarin-based | 0.1 | 7.0 | 1.5 |

Ex. = Example,
CEx. = Comparative Example

TABLE 2

(Exposure shielding properties of laminates obtained from PP3)

| High-pressure mercury lamp | | | | |
|---|---|---|---|---|
| Irradiation dose (mJ/cm$^2$) | 300 | 500 | 700 | 1,000 |
| Transmissivity (%) | 0 | 0 | 0 | 0 |
| Amount of transmitted light (mJ/cm$^2$) | 0 | 0 | 0 | 0 |
| Metal halide lamp | | | | |
| Irradiation dose (mJ/cm$^2$) | 300 | 500 | 700 | 1,000 |
| Transmissivity (%) | 4.3 | 2.8 | 2.0 | 1.4 |
| Amount of transmitted light | 13 | 14 | 14 | 14 |

TABLE 2-continued (Exposure shielding properties of laminates obtained from PP3)

(mJ/cm²)

EXAMPLES 7-10

A prepreg having a resin content of 45% (PP7) was prepared in the same manner as in Example 1 except that the varnish for impregnation was replaced with a varnish obtained by adding xanthone (to be referred to as AX hereinafter) to V1 such that the proportion of AX based on the resin solid content was 1.0%.

A prepreg having a resin content of 45% (PP8) was prepared in the same manner as in Example 1 except that the varnish for impregnation was replaced with a varnish obtained by adding AX to V1 such that the proportion of AX based on the resin solid content was 0.5%.

A prepreg having a resin content of 45% (PP9) was prepared in the same manner as in Example 1 except that the varnish for impregnation was replaced with a varnish obtained by adding AX, ESX and BTA to V1 such that the proportions of AX, ESX and BTA in this order based on the resin solid content was 1.0%, 2.0% and 2.0%.

Further, AX was added to a silane-coupling agent, and a woven glass fabric having a thickness of 0.1 mm was treated with the silane coupling agent to obtain a substrate having an AX adherence amount of 0.5%. This substrate was impregnated with V1 in the same manner as in Example 1 to obtain a prepreg having a resin content of 45% (to be referred to as PP10 hereinafter).

Double-side, copper-clad laminates were prepared from PP7 to PP10 in the same manner as in Example 1, and treated and measured for a relative fluorescence amount in the same manner as in Example 1. Table 3 shows the results. Further, the double-side, copper-clad laminate obtained from PP9 was treated and measured for exposure shielding properties in the same manner as in Example 3 (laminate obtained from PP3) to show the same results within a measurement error.

TABLE 3

| Example | Prepreg | Compound | Proportion | Relative fluorescence amount Unclad surface | Copper-clad surface |
| --- | --- | --- | --- | --- | --- |
| Ex. 7 | PP7 | AX | 1.0 | 50 | 20 |
| Ex. 8 | PP8 | AX | 0.5 | 30 | 12 |
| Ex. 3 | PP9 | AX | 1.0 | 55 | 25 |
|  |  | ESX | 2.0 |  |  |
|  |  | BTA | 2.0 |  |  |
| Ex. 10 | PP10 | AX (adhering to substrate) | 0.5 | 30 | 13 |

EXAMPLES 11-14

A prepreg having a resin content of 45% (PP11) was prepared in the same manner as in Example 1 except that the varnish for impregnation was replaced with a varnish obtained by adding fravianic acid (to be referred to as FRA hereinafter) to V1 such that the proportion of FRA based on the resin solid content was 0.03%.

A prepreg having a resin content of 45% (PP12) was prepared in the same manner as in Example 1 except that the varnish for impregnation was replaced with a varnish obtained by adding FRA to V1 such that the proportion of FRA based on the resin solid content was 0.003%.

A prepreg having a resin content of 45% (PP13) was prepared in the same manner as in Example 1 except that the varnish for impregnation was replaced with a varnish obtained by adding FRA, ESX and BTA to V1 such that the proportions of AX, ESX and BTA in this order based on the resin solid content was 0.03%, 2.0% and 2.0%.

Further, FRA was added to a silane-coupling agent, and a woven glass fabric having a thickness of 0.1 mm was treated with the silane coupling agent to obtain a substrate having an FRA adherence amount of 0.5%. This substrate was impregnated with V1 in the same manner as in Example 1 to obtain a prepreg having a resin content of 45% (to be referred to as PP14 hereinafter).

Double-side, copper-clad laminates were prepared from PP10 to PP13 in the same manner as in Example 1, and treated and measured for a relative fluorescence amount in the same manner as in Example 1. Table 4 shows the results. Further, the double-side, copper-clad laminate obtained from PP13 was treated and measured for exposure shielding properties in the same manner as in Example 3 (laminate obtained from PP3) to show the same results within a measurement error.

TABLE 4

| Example | Prepreg | Compound | Proportion | Relative fluorescence amount Unclad surface | Copper-clad surface |
| --- | --- | --- | --- | --- | --- |
| Ex. 11 | PP11 | FRA | 0.03 | 50 | 20 |
| Ex. 12 | PP12 | FRA | 0.003 | 30 | 12 |
| Ex. 3 | PP13 | FRA | 0.03 | 55 | 25 |
|  |  | ESX | 2.0 |  |  |
|  |  | BTA | 2.0 |  |  |
| Ex. 10 | PP14 | FRA (adhering to substrate) | 0.05 | 30 | 13 |

What is claimed is:

1. A base board for a printed circuit board, which has an insulating layer containing 5.0 to 0.00001% by weight of at least one compound selected from the group consisting of compounds of the formulae (1), (2) and (3),

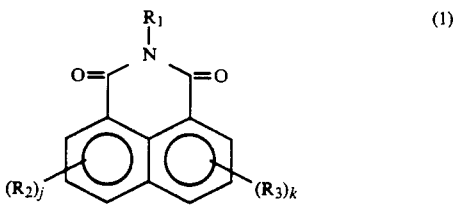

wherein $R_1$ is hydrogen, alkyl, substituted alkyl, aryl or substituted aryl, each of $R_2$ and $R_3$ is, independently of the other, hydroxyl, amino, carboxyl, sulfone, a salt of hydroxyl, a salt of amino, a salt of carboxyl, a salt of sulfone, hydroxyl to which alkyl or substituted alkyl is bonded, amino to which alkyl or substituted alkyl is bonded, carboxyl to which alkyl or substituted alkyl is bonded,
sulfone to which alkyl or substituted alkyl is bonded,
hydroxyl to which aryl or substituted aryl is bonded,
amino to which aryl or substituted aryl is bonded,
carboxyl to which aryl or substituted aryl is bonded,
sulfone to which aryl or substituted aryl is bonded,
hydroxyl to which acyl or substituted acyl is bonded,
amino to which acyl or substituted acyl is bonded,
carboxyl to which acyl or substituted acyl is bonded,
sulfone to which acyl or substituted acyl is bonded,
a salt of alkyl, a salt of aryl, a salt of acyl, halogen, alkyl, substituted alkyl
aryl or substituted aryl,
and each of j and k is an integer of 0 to 3,

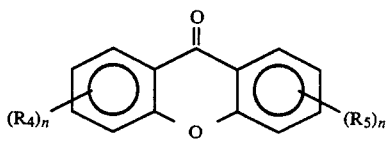
(2)

wherein each of $R_4$ and $R_5$ is, independently of the other, hydroxyl, saccharide, substituted saccharide, alkoxy, substituted alkoxy, acyl, substituted acyl, acyloxy, substituted acyloxy, alkyl, substituted alkyl, aryl or substituted aryl, and each of m and n is an integer of 0 to 4, provided that m and n are defined by $m+n \geq 1$, and

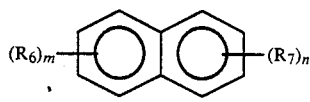
(3)

wherein each of $R_6$ and $R_7$ is, independently of the other, hydroxy, amino, sulfone, nitro or a salt of any one of these, provided that at least one of $R_6$ and $R_7$ is sulfone, nitro or a salt of these and each of m and n is an integer of 0 to 4, provided that m and n are defined by $m+n \geq 1$; wherein said insulating layer comprises a laminated product of a prepreg formed from a reinforcing substrate and a thermosetting resin, and said thermosetting resin comprises an alkylthioxanthone of the formula (4),

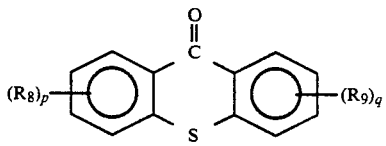
(4)

wherein each of $R_8$ and $R_9$ is alkyl, each of p and q is an integer of 0 to 4, and $p+q \geq 1$.

2. A base board according to claim 1, wherein the thermosetting resin contains 0.03 to 0.00005% by weight, based on the thermosetting resin, of the compound of the formula (1).

3. A base board according to claim 1, wherein the reinforcing material has 0.1 to 0.001% by weight, based on the reinforcing material, of the compound of the formula (1) adhering to the reinforcing material.

4. A base board according to claim 1, wherein the insulating layer has an adhesive layer formed from a thermosetting resin, and the adhesive layer contains 0.1 to 0.003% by weight of the compound of the formula (1).

5. A base board according to claim 4, wherein the adhesive layer is formed on a roughened surface of copper foil.

6. A base board according to claim 1, wherein the light-shielding agent is contained in an amount of 0.2 to 6% by weight based on the thermosetting resin.

7. A base board according to claim 1, wherein the compound of the formula (1) is excited by laser light having a wavelength of 442 nm to generate fluorescence and at least 60% of an amount of the generated fluorescence is in the wavelength range of 490 to 620 nm.

8. A base board according to claim 1, wherein fluorescence is generated under excitement by laser light having a wavelength of 442 nm in a relative fluorescence amount which is at least 10 times the relative fluorescence amount of fluorescence generated in an insulating layer containing none of the compounds of the formulae (1), (2) and (3).

9. A method of using the base board recited in claim 1 in which a pattern of fluorescence generated from a circuit pattern of a manufactured printed circuit board is compared with a pattern of fluorescence generated from a circuit pattern of a reference normal circuit pattern.

10. A method of using the base board recited in claim 1 in which a base board is simultaneously exposed for forming etched resist patterns or solder resist patterns.

11. A method of using the base board recited in claim 1 in which a pattern of fluorescence generated from a circuit pattern of a manufactured printed circuit board is compared with a pattern of fluorescence generated from a circuit pattern of a reference normal circuit pattern.

12. A method of using the prepreg recited in claim 1 as a base board for a printed circuit board.

13. A method of using the reinforcing substrate recited in claim 3 as a base board for a printed circuit board.

14. A method of using copper foil on which the adhesive layer is formed as recited in claim 5 as a base board for a printed circuit board.

15. A base board according to claim 1, wherein the compound of the formula (1) is selected from the group consisting of naphthalene-1,8-dicarbonylimide, 1-chloronaphthalene-4,5-dicarboxy-N-methylimide, 4,5-dichloronaphthalene-1,8-dicarboxylic acid-N-methylimide, N-phenyl-4-amino-1,8-naphthalimide, N-methyl-4-hydroxynaphthalimide, N-ethyl-4-hydroxynaphthalimide, N-(n-butyl)-4-(N'-butylamino)-1,8-naphthalimide, 2-$C_1$-$C_2$ alkoxy-1,8-naphthalenedicarboxylic acid-N-methylimide, N-(N'-$C_1$-$C_2$ alkoxy-1',8'-naphthalimide-(4')-yl) $C_1$-$C_2$ alkoxy-1,8-naphthalimide, N-(3'-methoxypropyl)-4-hydroxynaphthalimide and 1,4-bis-$C_1$-$C_2$ benzene.

16. A base board according to claim 1, wherein the compound of the formula (2) is selected from the group consisting of xanthone, gentianine, isogentianine, gentioside and gentisin.

17. A base board according to claim 1, wherein the compound of the formula (3) is selected from the group consisting of 2,4-dinitro-1-naphthol-7-sulfonic acid, 1-nitro-1-naphthol and 1-naphthylamine-2,7-disulfonic acid.

* * * * *